US011031663B2

(12) United States Patent
Darling et al.

(10) Patent No.: US 11,031,663 B2
(45) Date of Patent: *Jun. 8, 2021

(54) STACKED CERAMIC RESONATOR FILTER CONNECTED BY TABS TO A PRINTED CIRCUIT BOARD AND USABLE FOR FORMING AN RF MODULE AND A WIRELESS MOBILE DEVICE

(71) Applicant: Skyworks Solutions, Inc., Irvine, CA (US)

(72) Inventors: John Kenneth Darling, New Market, MD (US); Brian Christopher Eiker, Thurmont, MD (US); Robert Allen Burk, Brunswick, MD (US); Michael R. Frye, Frederick, MD (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/544,751

(22) Filed: Aug. 19, 2019

(65) Prior Publication Data

US 2020/0052357 A1 Feb. 13, 2020

Related U.S. Application Data

(63) Continuation of application No. 15/710,629, filed on Sep. 20, 2017, now Pat. No. 10,396,420.

(60) Provisional application No. 62/402,661, filed on Sep. 30, 2016.

(51) Int. Cl.
| | | |
|---|---|---|
| *H01P 1/205* | (2006.01) | |
| *H03H 9/46* | (2006.01) | |
| *H04B 1/40* | (2015.01) | |
| *H04B 1/00* | (2006.01) | |
| *H03H 9/50* | (2006.01) | |
| *H01P 1/213* | (2006.01) | |
| *H01P 7/04* | (2006.01) | |

(52) U.S. Cl.
CPC ............ *H01P 1/2053* (2013.01); *H01P 1/213* (2013.01); *H01P 7/04* (2013.01); *H03H 9/462* (2013.01); *H03H 9/50* (2013.01); *H04B 1/0057* (2013.01); *H04B 1/40* (2013.01)

(58) Field of Classification Search
CPC ...... H01P 1/2053; H01P 1/2056; H01P 1/205; H01P 7/04; H01P 11/007; H01P 11/008; H01P 1/2136
USPC .................................................. 333/206, 134
See application file for complete search history.

(56) References Cited

U.S. PATENT DOCUMENTS

| | | |
|---|---|---|
| 4,795,992 A | 1/1989 | Saito et al. |
| 5,557,246 A | 9/1996 | Ishihara et al. |
| 5,578,975 A | 11/1996 | Kazama et al. |
| 6,369,668 B1 * | 4/2002 | Atokawa et al. ..... H01P 1/2136 333/134 |

(Continued)

*Primary Examiner* — Benny T Lee
(74) *Attorney, Agent, or Firm* — Knobbe, Martens, Olson & Bear LLP

(57) ABSTRACT

A ceramic resonator radio frequency filter includes a printed circuit board, one or more first coaxial resonators disposed on the printed circuit board, and one or more second coaxial resonators disposed over the one or more first coaxial resonators so that the one or more first coaxial resonators and one or more second coaxial resonators are arranged in a stacked configuration. The one or more first coaxial resonators and second coaxial resonators electrically connected to the printed circuit board.

20 Claims, 7 Drawing Sheets

(56) References Cited

U.S. PATENT DOCUMENTS

| | | |
|---|---|---|
| 6,392,505 B1 | 5/2002 | Ito |
| 6,794,955 B2 | 9/2004 | Jang |
| 10,396,420 B2 * | 8/2019 | Darling et al. ......... H01P 1/213 |

* cited by examiner

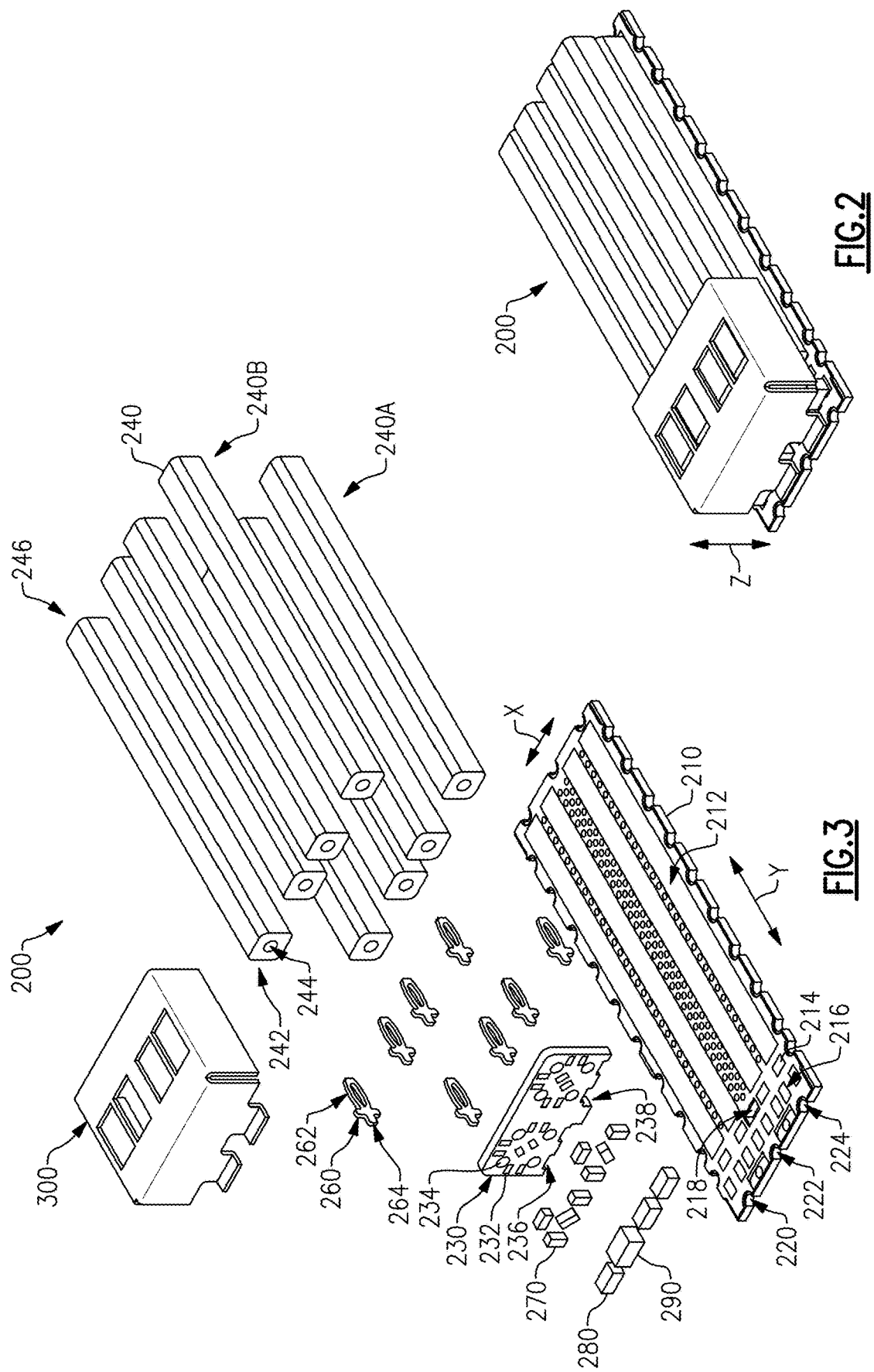

STACKED CERAMIC RESONATOR FILTER CONNECTED BY TABS TO A PRINTED CIRCUIT BOARD AND USABLE FOR FORMING AN RF MODULE AND A WIRELESS MOBILE DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the disclosure generally relate to electronic systems, and more particularly to ceramic resonator radio frequency filters for wireless communications.

Description of the Related Art

In conventional ceramic resonator filters, the resonators are arranged adjacent each other in a single plane. However, this arrangement can result in a space problem where the footprint of the conventional ceramic resonator filter is too wide.

SUMMARY

Accordingly, there is a need for ceramic resonator filters (for radio frequency wireless communications) that have a smaller footprint than conventional filter designs.

In accordance with one aspect, a ceramic resonator filter (for radio frequency wireless communications) is provided that has stacked resonators and a smaller footprint (e.g., in the widthwise X direction) than a conventional ceramic resonator filter with the same number of resonators. In one example, the ceramic resonator filter has a width that is less than half the width of a conventional ceramic resonator filter with the same number of resonators.

In accordance with one aspect of the disclosure, a ceramic resonator radio frequency filter is provided. The filter comprises a printed circuit board, one or more first coaxial resonators disposed on the printed circuit board, and one or more second coaxial resonators disposed over the one or more first coaxial resonators so that the one or more first coaxial resonators and one or more second coaxial resonators are arranged in a stacked configuration, the one or more first coaxial resonators and second coaxial resonators electrically connected to the printed circuit board.

In accordance with another aspect of the disclosure, a radio frequency module including a ceramic resonator filter is provided. The module comprises a ceramic resonator filter including a printed circuit board, one or more first coaxial resonators disposed on the printed circuit board, and one or more second coaxial resonators disposed over the one or more first coaxial resonators so that the one or more first coaxial resonators and one or more second coaxial resonators are arranged in a stacked configuration, the one or more first coaxial resonators and second coaxial resonators electrically connected to the printed circuit board. The module also comprises an input connection and an output connection coupled to the ceramic resonator filter.

In accordance with another aspect of the disclosure, a wireless mobile device including a ceramic resonator filter is provided. The wireless mobile device comprises a ceramic resonator filter including a printed circuit board, one or more first coaxial resonators disposed on the printed circuit board, and one or more second coaxial resonators disposed over the one or more first coaxial resonators so that the one or more first coaxial resonators and one or more second coaxial resonators are arranged in a stacked configuration, the one or more first coaxial resonators and second coaxial resonators electrically connected to the printed circuit board. The wireless mobile device also comprises a radio frequency transceiver electrically connected to the ceramic resonator filter, and an antenna electrically connected to the ceramic resonator filter.

In accordance with another aspect of the disclosure, a method of making a ceramic resonator radio frequency filter is provided. The method comprises positioning one or more first coaxial resonators on a printed circuit board, and positioning one or more second coaxial resonators over the one or more first coaxial resonators in a stacked configuration, the one or more first coaxial resonators and second coaxial resonators electrically connected to the printed circuit board.

BRIEF DESCRIPTION OF THE DRAWINGS

FIG. 2 is a perspective view of an embodiment of a ceramic resonator filter.

FIG. 3 is an exploded view of the ceramic resonator filter of FIG. 2.

DETAILED DESCRIPTION

Figure 1:
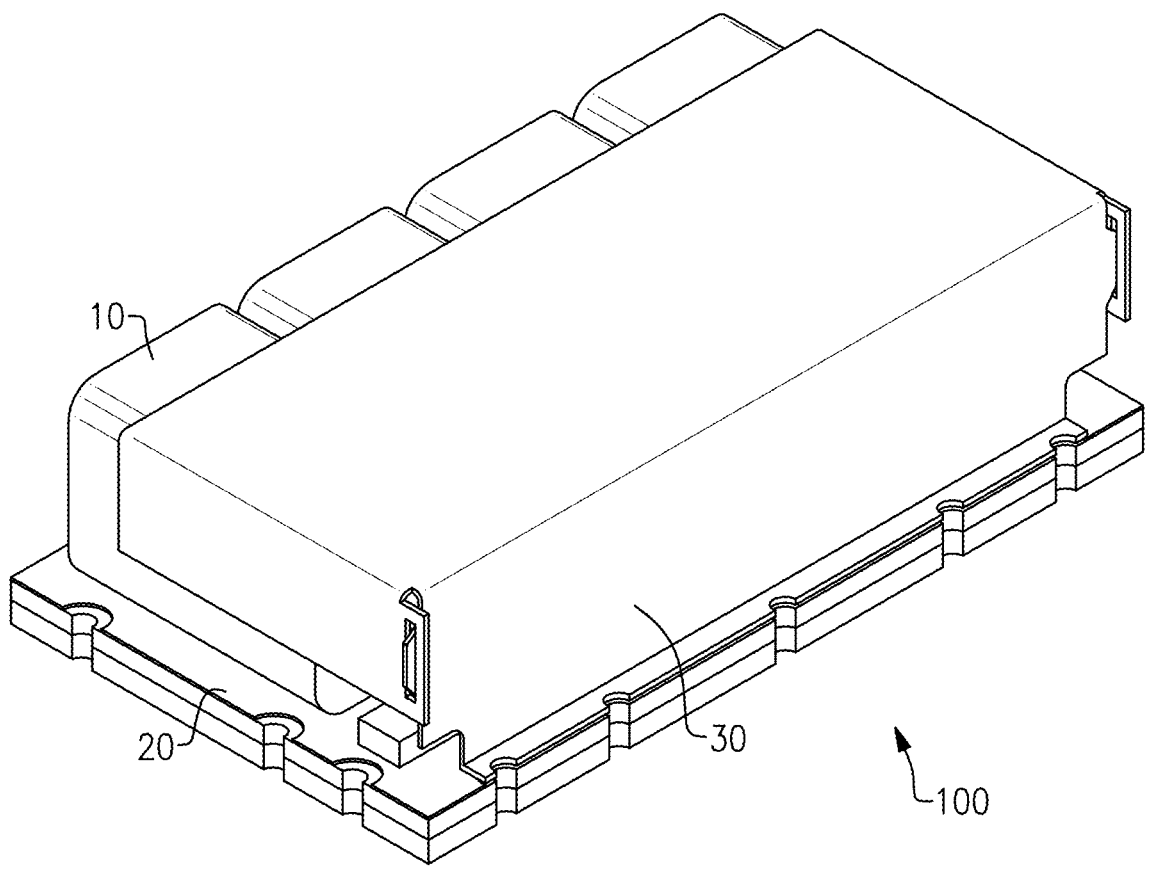
FIG. 1 is a perspective view of a conventional ceramic resonator filter.

FIG. 1 shows a conventional ceramic resonator filter 100, which has a plurality resonators 10 (e.g., ceramic coaxial resonators) disposed adjacent each other and aligned along the same plane. The resonators 10 are disposed on a printed circuit board 20, and at least a portion of the resonators 10 is covered with a case 30. The conventional ceramic resonator filter 100 in FIG. 1 has four resonators. However, in other variations, the conventional ceramic resonator filter 100 can have fewer (e.g., 2) or more (e.g., 6, 8) resonators, all arranged adjacent each other along the same plane.

FIGS. 2-3 show one embodiment of an improved ceramic resonator filter assembly 200 (hereafter "filter assembly") that can be used in radio frequency wireless applications. As shown in FIG. 3, the filter assembly 200 can have a printed circuit board 210 with one or more strip pads 212. The printed circuit board 200 can extend along an X and Y direction. In the illustrated embodiment, the printed circuit board 200 has a generally rectangular shape. The printed circuit board 210 can optionally have one or more solder pads 214 proximal the strip pads 212 and optionally have one or more solder pads 216 proximate an edge of the printed circuit board 210. In the illustrated embodiment, the printed circuit boards 210 can also optionally have an aperture 218 defined therein, which is described further below. The printed circuit board 210 can also include a receiving port 220, a common port 222 and a transmission port 224. In the illustrated embodiment, the ports 220, 222, 224 are defined on an end edge of the printed circuit board 210. In other embodiments, the ports 220, 222, 224 can be located on a side edge of the printed circuit board 210. In the illustrated embodiment, the ports 220, 222, 224 are closer together than in a conventional ceramic resonator filter 100 of FIG. 1, which provides a different isolation port to port, creates a cross coupled effect on the filter response and may provide an inherent transmission zero or trap, as discussed below. The solder pads 214, 216 and strip pads 212 can be made of any suitable material (e.g., gold).

The filter assembly 200 can also include a second printed circuit board 230 that extends at an angle relative to the printed circuit board 210. In one embodiment, the second printed circuit board 230 can extend substantially perpendicular to the printed circuit board 210. The second printed circuit board 230 can have one or more (e.g., a plurality of) solder pads 232 and one or more (e.g., a plurality of) apertures 234. A bottom edge 236 of the second printed circuit board 230 can optionally have a protrusion or tab 238 that can extend at least partially into the aperture 218 in the printed circuit board 210 when the second printed circuit board 230 is coupled to it. The connection of the tab 238 and aperture 218 advantageously allows the alignment of the printed circuit boards 210, 230 to be maintained. Optionally, the bottom edge 236 of the second printed circuit board 230 can be attached to the printed circuit board 210 (e.g., can be soldered to the one or more solder pads 214). In another embodiment, the second printed circuit board 230 can be coupled to the printed circuit board 210 in other suitable manners. For example, in one embodiment, the printed circuit board 210 can have a groove or slot into which the bottom edge 236 of the second printed circuit board 230 extends. In another embodiment, the printed circuit board 210 can have one or more clamp members (e.g., located generally where the one or more solder pads 214 are shown in FIG. 3 that can clamp onto the bottom edge 236 of the second printed circuit board 230.

One or more resonators 240 can be coupled to the printed circuit board 210 in a stacked configuration. In the illustrated embodiment, the one or more resonators 240 include a first row of resonators 240A that are disposed on the printed circuit board 210 and a second row of resonators 240B that are disposed on the first row of resonators 240A. The first row of resonators 240A (e.g., a bottom surface of the resonators 240A) can optionally be soldered to the strip pads 212 on the printed circuit board 210. The second row of resonators 240B (e.g., a bottom surface of the resonators 240B) can optionally be soldered to the first row of resonators 240A (e.g., soldered to a top surface of the resonators 240A).

In the illustrated embodiment, each of the resonators 240A, 240B can have an open end 242 with an aperture 244 and an opposite closed end 246 or short circuited end. The resonators 240A, 240B can a quarter wave ($\lambda/4$) coaxial resonator or short circuited resonator. In other embodiments, the resonators can be other suitable types (e.g., a half wave ($\lambda/2$) coaxial resonator or short circuited resonator). In the illustrated embodiment, the resonators 240A, 240B have a size of 2 mm (e.g., width of 2 mm). However, in other embodiments the resonators 240A, 240B can have other suitable dimensions (e.g., width of 4 mm, 6 mm, etc.). In the illustrated embodiment, the first row of resonators 240A has four resonators 240 and the second row of resonators 240B has four resonators 240. However, one of skill in the art will recognize that the filter assembly 200 can have any number of resonators 240 (e.g., five, six, eight, ten resonators, etc.), where the number of resonators 240 is the same in the first row 240A as in the second row 240B.

With continued reference to FIG. 3, the filter assembly 200 can have one or more (e.g., a plurality of) tabs 260 that can have a distal portion 262 and a proximal portion 264. The distal portion 262 of the one or more tabs 260 can extend into the apertures 244 of the resonators 240A, 240B. The proximal portion 264 of the one or more tabs 260 can extend into (e.g., through) the apertures 234 in the second printed circuit board 230. One or more (e.g., a plurality of) capacitors 270 can couple (e.g., be soldered) to solder pads 232 on the second printed circuit board 230, and provide for electrical connection between the resonators 240 to communicate signals from one of the resonators 240 to another of the resonators 240. In the illustrated embodiment, one or more capacitors 280 and one or more inductor 290 can couple (e.g., be soldered) to the one or more solder pads 216. A case 300 can be disposed over the stacked resonators 240A, 240B and the second printed circuit board 230 and couple to the printed circuit board 210. The case 300 contains the radio frequency energy to provide improved frequency rejection.

Figure 4A:
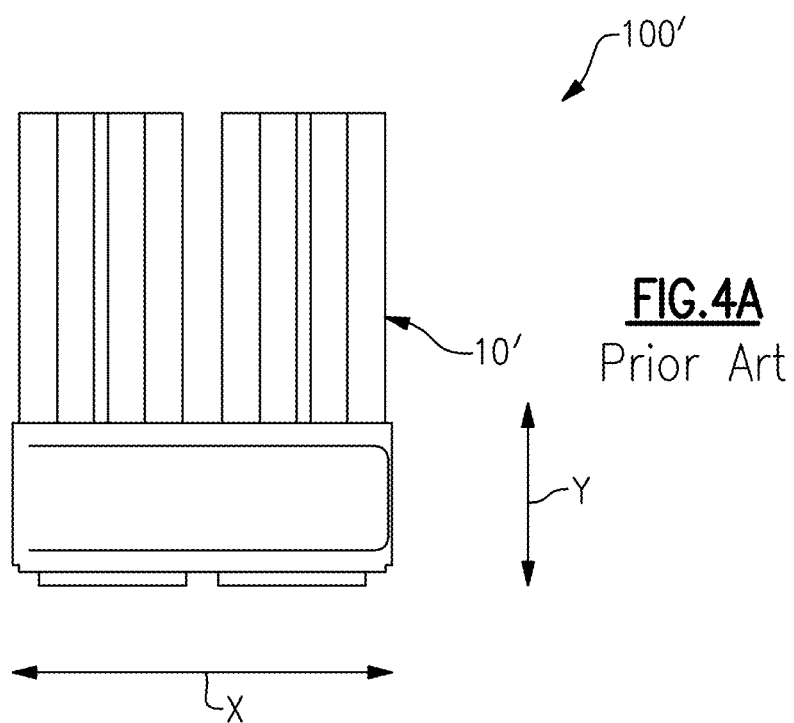
FIG. 4A is a top view of a conventional ceramic resonator filter.
Figure 4B:
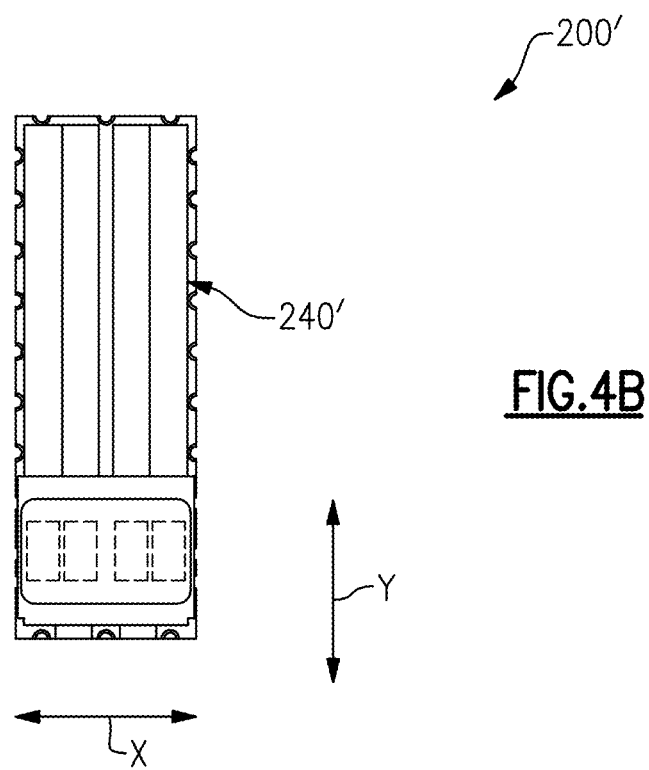
FIG. 4B is a top view of an embodiment of a ceramic resonator filter.

Advantageously, the filter assembly 200 allows for a smaller footprint in the X direction, as compared to the conventional ceramic resonator filter 100 of FIG. 1. FIG. 4A shows a schematic top view of a conventional ceramic resonator filter 100' where resonators 10' are aligned along a single plane. The resonator filter 100' is approximately 0.8 inches wide in the X direction (e.g., 0.803 inches). FIG. 4B shows a schematic top view of a ceramic resonator filter 200' with stacked resonators 240', in a manner similar to that described above with respect to FIGS. 2-3. The resonator filter 200' is approximately 0.39 inches wide in the X direction (e.g., 0.386 inches), which is less than half the width of the conventional resonator filter 100'. In FIGS. 4A-4B, the conventional resonator filter 100' and the resonator filter 200' have approximately the same dimension in the Y direction.

However, the height of the resonator filter 200' in the Z direction (e.g., a height direction perpendicular to the X and Y directions and similar to Z direction in FIGS. 2-3) is greater than the height of the resonator filter 100' in the Z direction by approximately the dimension of the resonators 240' since the resonator filter 200' has a second row of resonators 240' stacked over a first row of resonators 240', whereas the resonator filter 100' has only a single row of resonators 10'. For example, with respect to the embodiment shown in FIGS. 2-3, the height of the filter assembly 200 in the Z direction (FIG. 2) is greater than a height of a filter assembly with the same number of resonators 240 arranged in a conventional matter (i.e., all resonators adjacent each other along a single plane) by approximately the height of the resonators 240. Where the resonators 240 have a dimension of approximately 2 mm, the filter assembly 200 would have a height in the Z direction that is approximately 2 mm higher than a height of a filter assembly with the same number of resonators 240 arranged in a conventional manner along a single plane.

Figure 5:
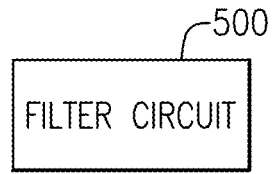
FIG. 5 schematically shows that one or more features of the present disclosure can be implemented as a ceramic filter circuit.
Figure 6:
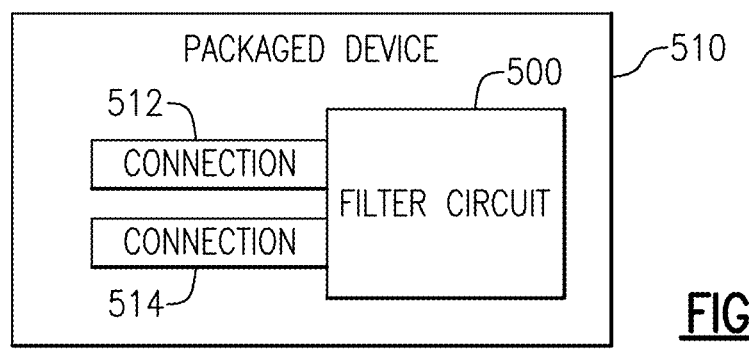
FIG. 6 shows that the ceramic filter circuit of FIG. 5 can be implemented in a packaged device.

FIG. 5 schematically shows that embodiments of the ceramic resonator filter with stacked resonators, such as the filter assembly 200 with stacked resonators 240, can be implemented as a ceramic filter circuit 500. Such a ceramic filter circuit can be implemented in a number of products, devices, and/or systems. For example, FIG. 6 shows that in some embodiments, a packaged device 510 can include a ceramic filter circuit 500 configured to be coupled to input and output connections 512, 514 on a same side and provide performance features as described herein. Such a packaged device can be a dedicated ceramic RF filter module, or include some other functional components.

Figure 7:
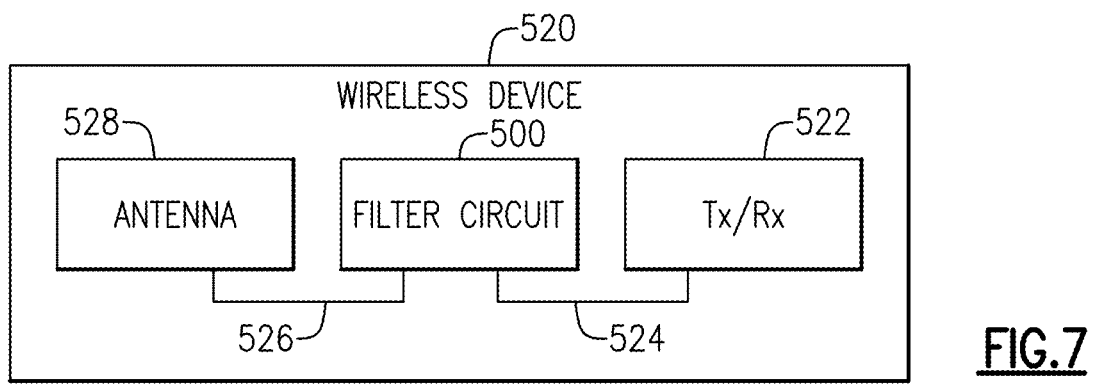
FIG. 7 shows that the ceramic filter circuit of FIG. 5 can be implemented in a wireless device.

FIG. 7 shows that in some embodiments, a ceramic filter circuit 500 can be implemented in a wireless device 520. Such a wireless device can include an antenna 528 in communication with the ceramic filter circuit (line 526). The wireless device 520 can further include a circuit 522 configured to provide transmit (Tx) and/or receive (Rx) functionalities. The Tx/Rx circuit 522 is shown to be in communication with the ceramic filter circuit 500 (line 524). Examples of such wireless devices 520 can include a public safety radio, a transceiver, any mobile device, test equipment, intermediate frequency filter in a receiving chain, etc.

Figure 8:
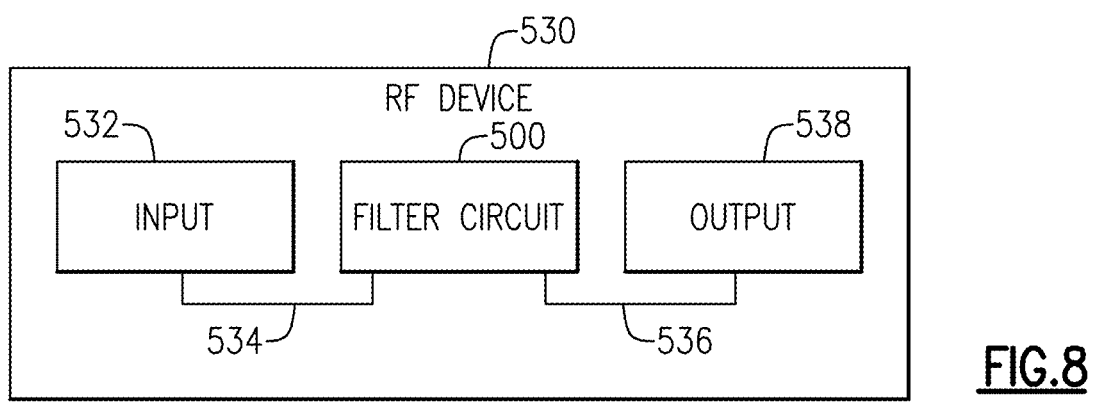
FIG. 8 shows that the ceramic filter circuit of FIG. 5 can be implemented in a wire-based of wireless RF device

FIG. 8 shows that in some embodiments, a ceramic filter circuit 500 can be implemented in an RF device 530. Such a device can include an input component 532 that provides an input RF signal to the ceramic filter circuit (line 534), and an output component 538 that receives a filtered RF signal from the ceramic filter circuit 500 (line 536). The RF device 530 can be a wireless device such as the example of FIG. 7, a wire-based device, or some combination thereof.

In some implementations, ceramic RF filters having one or more band pass filtering features as described herein can be utilized in a number of applications involving systems and devices. Such applications can include but are not limited to cable television (CATV); wireless control system (WCS); microwave distribution system (MDS); industrial, scientific and medical (ISM); cellular systems such as PCS (personal communication service), digital cellular system (DCS) and universal mobile communications system (UMTS); and global positioning system (GPS).

Figure 9:
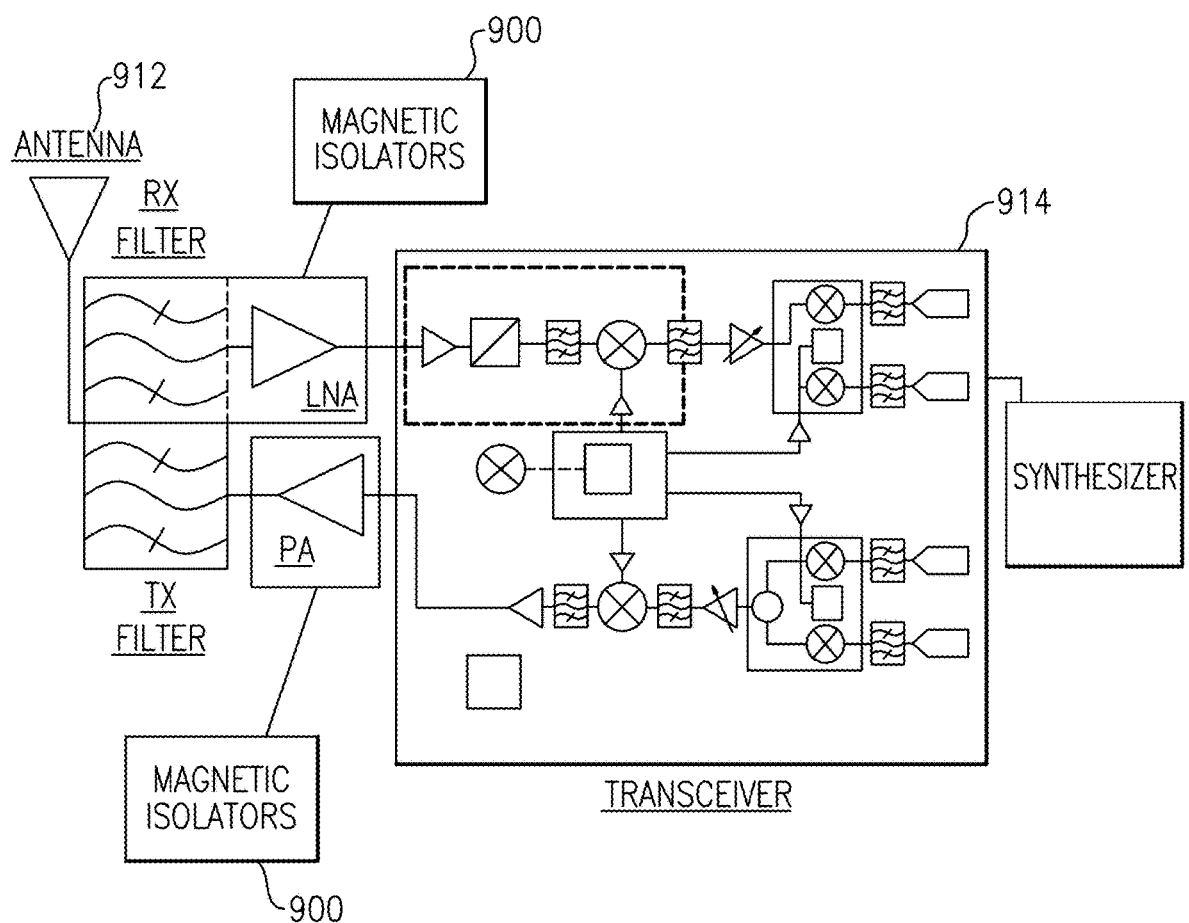
FIG. 9 illustrates a radio frequency device including an embodiment of a ceramic resonator filter.

Further, in some embodiments, the disclosed ceramic resonator filter can be used with RF devices. As shown in FIG. 9, such an RF apparatus can include an antenna 912 that is configured to facilitate transmission and/or reception of RF signals. Such signals can be generated by and/or processed by a transceiver 914. For transmission, the transceiver 914 can generate a transmit signal that is amplified by a power amplifier (PA) and filtered (Tx Filter) for transmission by the antenna 912. For reception, a signal received from the antenna 912 can be filtered (Rx Filter) and amplified by a low-noise amplifier (LNA) before being passed on to the transceiver 914. In some embodiments, the ceramic filters shown in FIG. 9 can be an embodiment of a ceramic resonator filter as disclosed herein.

In some embodiments, ceramic resonator filters can be implemented in RF applications such as a wireless telecommunication base-station. Such a wireless base-station can include one or more antennas, such as the example described in reference to FIG. 9, configured to facilitate transmission and/or reception of RF signals. Such antenna(s) can be coupled to circuits and devices having one or more filters as described herein. In some embodiments, the base can have a transceiver, a synthesizer, an RX filter, a TX filter, magnetic isolators and an antenna. The magnetic isolators 900 can be incorporated in a single channel PA and connectorized, integrated triplate or microstrip drop-in.

Figure 10:
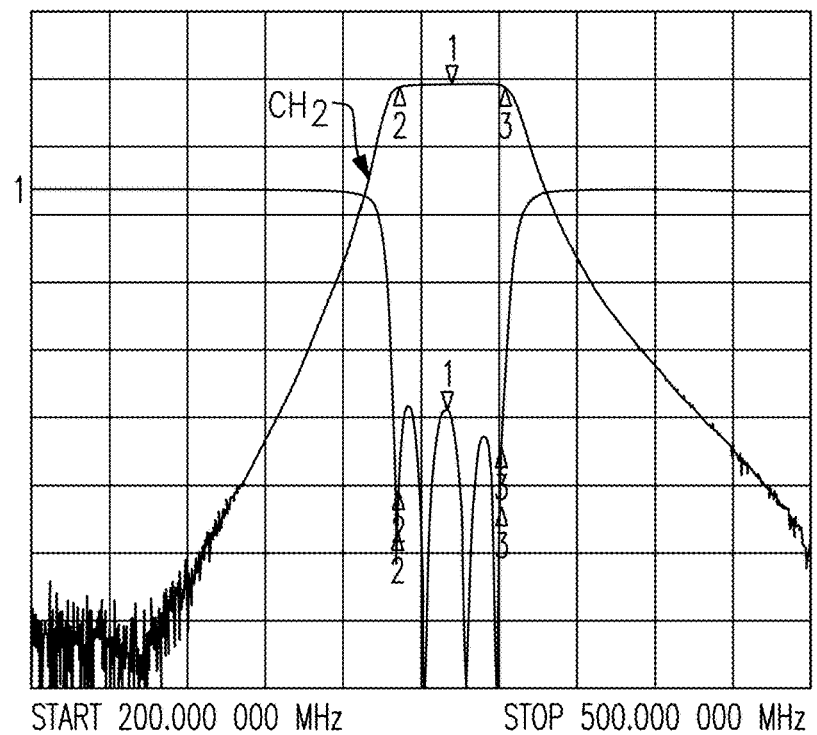
FIG. 10 shows an example response plot (decibels (dB) along the Y axis and frequency along the X axis) of a conventional ceramic resonator filter with resonators aligned along a single plane, as shown in FIG. 10A.
Figure 10A:
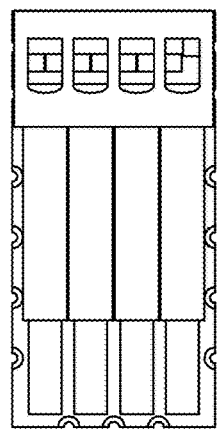
Figure 11:
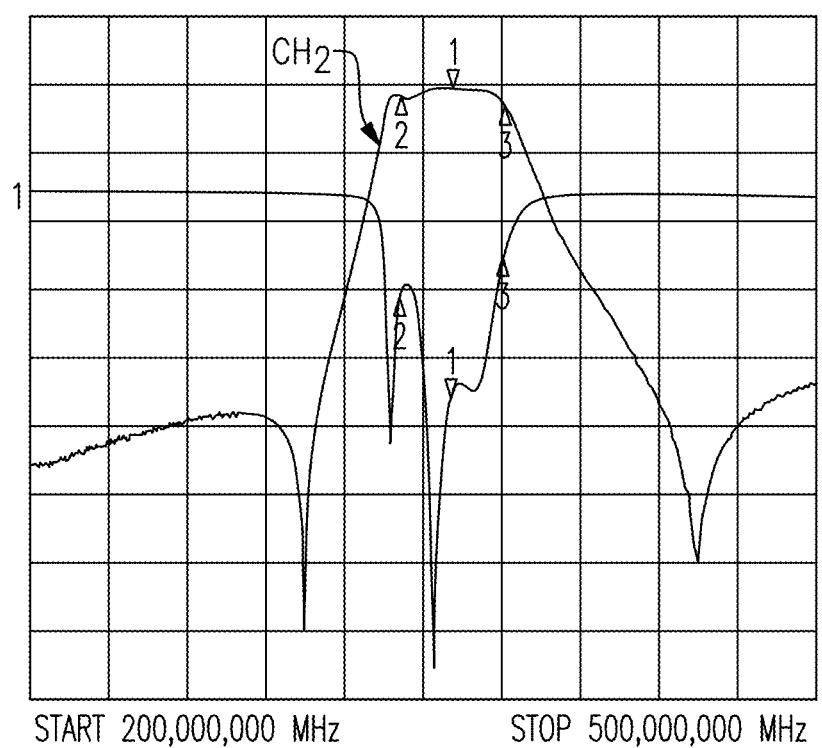
FIG. 11 shows an example response plot (decibels (dB) along the Y axis and frequency along the X axis) of a ceramic resonator filter with stacked resonators, as shown in FIG. 11A.
Figure 11A:
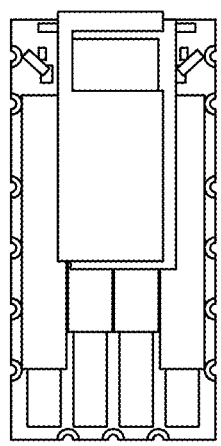

FIG. 10 shows an example response plot (decibels (dB) along the Y axis and frequency in MHz along the X axis) of a conventional ceramic resonator filter with four resonators aligned along a single plane, as shown in FIG. 10A. FIG. 11 shows an example response plot (decibels (dB) along the Y axis and frequency in MHz along the X axis) of a ceramic resonator filter with four resonators, where two resonators are stacked on top of two other resonators, as shown in FIG. 11A, and which has a width in the X direction (e.g., a widthwise direction similar to X direction in FIGS. 2-3) that is approximately one half of the width of the conventional ceramic resonator filter in FIG. 10. In both FIGS. 10 and 11, "CH1" corresponds to S11 response parameter (reflection back from the input), "CH2" corresponds to S21 response parameter (forward power transfer from the input to the output), and "CH4" corresponds to S22 response parameter (reflection back from the output). Also in both figures, the center frequency (markers 1) is at approximately 360 MHz, and the upper (markers 3) and lower (markers 2) cutoff frequencies are at approximately 380 MHz and 340 MHz, respectively (to yield a bandwidth BW of approximately 40 MHz). As shown in FIGS. 10 and 11, the stacked resonator filter achieves generally the same performance as the conventional ceramic resonator filter, but with a smaller footprint. FIG. 10 shows that the response of the conventional ceramic resonator filter provides a generally continuous slope outside the bandwidth (BW) toward the noise floor. In contrast, FIG. 11 shows an abrupt transmission zero closer to the passband, which can be a desirable attribute in some applications.

While certain embodiments of the invention have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. For example, one portion of one of the embodiments described herein can be substituted for another portion in another embodiment described herein. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A ceramic resonator radio frequency filter comprising:
   a first plurality of coaxial resonators arranged in a first row;
   a second plurality of coaxial resonators arranged in a second row aligned with and disposed over the first row;
   a printed circuit board extending along a plane transverse to the first and second plurality of coaxial resonators and having a plurality of spaced apart through holes that extend through the printed circuit board; and
   a plurality of tabs, each of the tabs having one end that extends through a respective one of the spaced apart through holes and an opposite end that extends into an opening in a corresponding one of the first and second plurality of coaxial resonators.

2. The filter of claim 1 wherein the first and second plurality of coaxial resonators are quarter wavelength coaxial resonators.

3. The filter of claim 1 wherein the first plurality of coaxial resonators are disposed on a support structure extending along a plane parallel to a first direction.

4. The filter of claim 3 wherein the support structure is a second printed circuit board.

5. The filter of claim 4 wherein the second printed circuit board includes a plurality of strip pads onto which the first plurality of coaxial resonators are respectively disposed.

6. The filter of claim 5 wherein the first plurality of coaxial resonators are soldered to the plurality of strip pads.

7. The filter of claim 4 wherein the printed circuit board is soldered to the second printed circuit board.

8. The filter of claim 3 wherein the printed circuit board is coupled to the support structure.

9. A radio frequency module comprising:
   a ceramic resonator filter including a first plurality of coaxial resonators arranged in a first row, a second plurality of coaxial resonators arranged in a second row aligned with and disposed over the first row, a printed circuit board extending along a plane transverse to the first and second plurality of coaxial resonators and having a plurality of spaced apart through holes that extend through the printed circuit board, and a plurality of tabs, each of the tabs having one end that extends through a respective one of the spaced apart through holes and an opposite end that extends into an opening in a corresponding one of the first and second plurality of coaxial resonators; and an input connection and an output connection coupled to the ceramic resonator filter.

10. The radio frequency module of claim 9 wherein the first and second plurality of coaxial resonators are quarter wavelength coaxial resonators.

11. The radio frequency module of claim 9 wherein the first plurality of coaxial resonators are disposed on a support structure extending along a plane parallel to a first direction.

12. The radio frequency module of claim 11 wherein the support structure is a second printed circuit board.

13. The radio frequency module of claim 12 wherein the second printed circuit board includes a plurality of strip pads onto which the first plurality of coaxial resonators are respectively disposed.

14. The radio frequency module of claim 13 wherein the first plurality of coaxial resonators are soldered to the plurality of strip pads.

15. The radio frequency module of claim 12 wherein the printed circuit board is soldered to the second printed circuit board.

16. The radio frequency module of claim 11 wherein the printed circuit board is coupled to the support structure.

17. A wireless mobile device comprising:

a ceramic resonator filter including a first plurality of coaxial resonators arranged in a first row, a second plurality of coaxial resonators arranged in a second row aligned with and disposed over the first row, a printed circuit board extending along a plane transverse to the first and second plurality of coaxial resonators and having a plurality of spaced apart through holes that extend through the printed circuit board, and a plurality of tabs, each of the tabs having one end that extends through a respective one of the spaced apart through holes and an opposite end that extends into an opening in a corresponding one of the first and second plurality of coaxial resonators;

a radio frequency transceiver electrically connected to the ceramic resonator filter; and an antenna electrically connected to the ceramic resonator filter.

18. The wireless mobile device of claim 17 wherein the first and second plurality of coaxial resonators are quarter wavelength coaxial resonators.

19. The wireless mobile device of claim 17 wherein the first plurality of coaxial resonators are disposed on a second printed circuit board extending along a plane parallel to a first direction.

20. The wireless mobile device of claim 19 wherein the second printed circuit board includes a plurality of strip pads onto which the first plurality of coaxial resonators are respectively disposed.

* * * * *